US008063549B2

(12) United States Patent
Nagao et al.

(10) Patent No.: US 8,063,549 B2
(45) Date of Patent: Nov. 22, 2011

(54) LIGHT-EMITTING DIODE ELEMENT AND METHOD FOR FABRICATING THE SAME

(75) Inventors: Nobuaki Nagao, Gifu (JP); Takahiro Hamada, Osaka (JP); Akihiro Itoh, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/036,651

(22) Filed: Feb. 28, 2011

(65) Prior Publication Data

US 2011/0148284 A1 Jun. 23, 2011

Related U.S. Application Data

(63) Continuation of application No. PCT/JP2010/006223, filed on Oct. 20, 2010.

(30) Foreign Application Priority Data

Oct. 20, 2009 (JP) ................................ 2009-241155

(51) Int. Cl.
*H05B 33/00* (2006.01)

(52) U.S. Cl. ............................ 313/498; 445/23; 257/13

(58) Field of Classification Search .................. 313/498; 257/13, 76; 445/24

See application file for complete search history.

(56) References Cited

U.S. PATENT DOCUMENTS

| | | | |
|---|---|---|---|
| 5,895,938 | A | 4/1999 | Watanabe et al. |
| 2008/0251798 | A1 | 10/2008 | Ogihara et al. |
| 2010/0320450 | A1 | 12/2010 | Fujioka |

FOREIGN PATENT DOCUMENTS

| | | |
|---|---|---|
| JP | 9-283797 | 10/1997 |
| JP | 2008-263126 | 10/2008 |
| JP | 2009-200207 | 9/2009 |

OTHER PUBLICATIONS

Taniyasu et al. "MOVPE growth of single-crystal hexagonal AlN on cubic diamond", Journal of Crystal Growth Jan. 14, 2009.*

Shuji Nakamura et al., "Superbright Green InGaN Single-Quantum-Well-Structure Light-Emitting Diodes," Jpn. J. Appl. Phys. vol. 34 (1995) pp. L1332-L1335.

* cited by examiner

*Primary Examiner* — Toan Ton
*Assistant Examiner* — Andrew Coughlin
(74) *Attorney, Agent, or Firm* — McDermott Will & Emery LLP

(57) ABSTRACT

A substrate for semiconductor device includes a graphite substrate, an amorphous carbon layer having a thickness of not less than 20 nm and not more than 60 nm formed on the graphite substrate and an AlN layer formed on the amorphous carbon layer. The amorphous carbon layer is obtained by oxidizing the surface of the graphite substrate.

19 Claims, 7 Drawing Sheets

107
106
105
104
103
102
3
2
1
108

BH21-29

*FIG.3(a)*
*FIG.3(b)*
*FIG.4(a)*
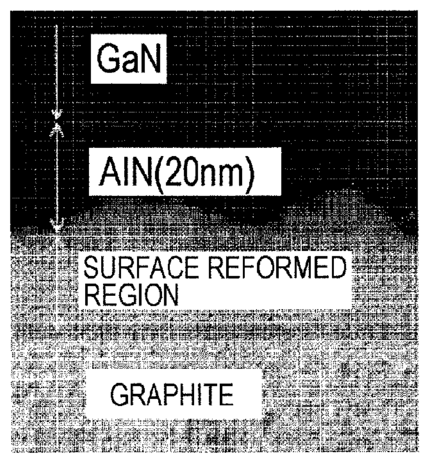
*FIG.4(b)*
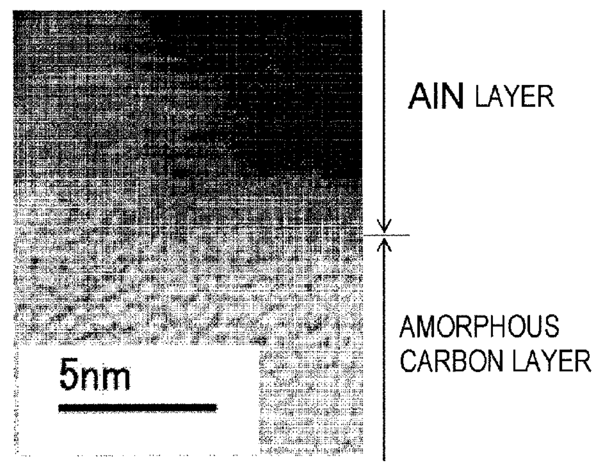

LIGHT-EMITTING DIODE ELEMENT AND METHOD FOR FABRICATING THE SAME

This is a continuation of International Application No. PCT/JP2010/006223, with an international filing date of Oct. 20, 2010, which claims priority of Japanese Patent Application No. 2009-241155, filed on Oct. 20, 2009, the contents of which are hereby incorporated by reference.

BACKGROUND OF THE INVENTION

1. Field of the Invention

The present invention relates to a light-emitting diode element composed of a nitride semiconductor.

2. Description of the Related Art

Recently, a semiconductor element composed of a nitride semiconductor such as gallium nitride (GaN) has been researched and developed actively. A semiconductor light-emitting element composed of nitride semiconductors comprising aluminum nitride (AlN), gallium nitride (GaN) or, indium nitride (InN), or mixed crystal thereof emits light in a wide wavelength region from ultraviolet or blue to infrared by varying its film composition. As its application, a visible-range light-emitting diode using a nitride semiconductor has already been commercially-available (for example, Shuji Nakamura et. al., Jpn. J. Appl. Phys. Vol. 34 (1995) L. 1332-L.1335).

FIG. 13 shows a cross-sectional view of a light-emitting diode element according to prior art. As shown in FIG. 13, the conventional light-emitting diode element has a low-temperature grown buffer layer 102 consisting of GaN, an n-type GaN cladding layer 103, a quantum well layer 104 consisting of $In_xGa_{1-x}N$, a p-type cladding layer 105 consisting of p-type GaN, and a p-type contact layer 106 consisting of p-type GaN. These layers are grown in this order on the main surface of a sapphire substrate 101 with a plane orientation of (0001). A p-side electrode 107 is formed on the p-type contact layer 106, and an n-side electrode 108 is formed on the selectively exposed region of the n-type GaN layer 103.

According to the prior art, in order to suppress carrier recombination due to non-luminescence transition derived from lattice defects or threading dislocations, a nitride semiconductor film having significantly low defects in the crystal has to be prepared. For this reason, a monocrystalline substrate such as a sapphire substrate is used, but such a monocrystalline substrate is very expensive.

In order to solve the above-mentioned problem, a method for preparing a polycrystalline nitride semiconductor film on a graphite substrate by a pulse sputtering method has been proposed (Japanese Laid-open patent publication No. 2009-200207).

However, since the GaN film prepared on the graphite substrate by a pulse sputtering method is polycrystalline and has many defects, it fails to be suitable for light-emitting diodes or electronic devices. Furthermore, since the nitride semiconductor film prepared by a sputtering method is damaged severely due to discharged plasma during the film growth, it is well known that the crystal of the film contains extremely many defects. Accordingly, in a case where the method for preparing the nitride semiconductor by the pulse sputtering method according to Patent Document 1 is used, it is very difficult to prepare p-type GaN necessary to prepare a light-emitting diode element.

The purpose of the present invention is to provide a nitride light-emitting diode element with high performance at low cost with use of a graphite substrate, which is non-monocrystalline substrate, by a Metal Organic Chemical Vapor Deposition (MOCVD), which is most suitable for fabricating a semiconductor device.

SUMMARY OF THE INVENTION

The method of the present invention is a method of fabricating a light-emitting diode, comprising the following steps (a) to (e):

a step (a) of treating a surface of a graphite substrate by oxygen-asking and forming an amorphous carbon layer having a thickness of not less than 20 nm and not more than 60 nm on the surface of the graphite substrate, a step (b) of forming an AlN layer on the amorphous carbon layer with MOCVD (Metal Organic Chemical Vapor Deposition), a step (c) of forming an n-type cladding layer comprising a nitride semiconductor on the AlN layer, a step (d) of forming a quantum well layer comprising a nitride semiconductor on the n-type cladding layer, and a step (e) of forming a p-type cladding layer comprising a nitride semiconductor on the quantum well layer.

In one embodiment, the method further comprises a step of forming a buffer layer (102) comprising a nitride semiconductor on the AlN layer prior to forming the n-type cladding layer.

In one embodiment, a p-side electrode is transparent.

In one embodiment, the quantum well layer includes a multi-quantum well layer.

A substrate according to the present invention comprises a graphite substrate, an amorphous carbon layer with a thickness of not less than 20 nanometers and not more than 60 nanometers formed on the graphite substrate, and an AlN layer formed on the amorphous carbon layer.

Another method of the present invention is a method of fabricating a substrate, comprising the following the steps (a) to (b):

a step (a) of treating a surface of a graphite substrate by oxygen-asking and forming a amorphous carbon layer having a thickness of not less than 20 nm and not more than 60 nm on the surface of the graphite substrate, a step (b) of forming the AlN layer on the amorphous carbon layer with MOCVD (Metal Organic Chemical Vapor Deposition).

A light-emitting diode comprising:

a graphite substrate, an amorphous carbon layer formed on the graphite substrate, an AlN layer formed on the amorphous carbon layer, an n-type cladding layer comprising a nitride semiconductor formed on the AlN layer, a quantum well layer comprising a nitride semiconductor formed on the n-type cladding layer, a p-type cladding layer comprising a nitride semiconductor formed on the quantum well layer, a p-side electrode electrically connected to the p-type cladding layer, and an n-side electrode electrically connected to the n-type cladding layer, wherein the amorphous carbon layer has a thickness of not less than 20 nm and not more than 60 nm.

In one embodiment, the light-emitting diode further comprises a buffer layer consisting of a nitride semiconductor interposed between the AlN layer and the n-type cladding layer.

In one embodiment, the p-side electrode is transparent.

In one embodiment, the quantum well layer includes a multi-quantum well layer.

The method of emitting a light with a light-emitting diode according to the present invention comprises the following steps (a) to (b), a step (a) of preparing the light-emitting diode comprising a graphite substrate, an amorphous carbon layer formed on the graphite substrate, an AlN layer formed on the amorphous carbon layer, an n-type cladding layer comprising a nitride semiconductor formed on the AlN layer, a quantum well layer comprising a nitride semiconductor formed on the n-type cladding layer, a p-type cladding layer comprising a nitride semiconductor formed on the quantum well layer, a p-side electrode electrically connected to the p-type cladding layer, and an n-side electrode electrically connected to the n-type cladding layer, wherein the amorphous carbon layer has a thickness of not less than 20 nm and not more than 60 nm, and a step (b) of applying a voltage between the p-side electrode and the n-type electrode to emit light from the quantum well layer.

In one embodiment, the p-side electrode is transparent.

In one embodiment, the quantum well layer includes a multi-quantum well layer.

The present invention allows the preparation of the light-emitting diode element directly on the graphite substrate with MOCVD by providing the amorphous carbon layer on the graphite substrate and growing a c-axis oriented film of AlN with MOCVD on the amorphous carbon layer. The light-emitting diode element with excellent property is obtained at low cost.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 3(*a*) shows a surface SEM observation image when the AlN was deposited with MOCVD on the graphite substrate which was not surface-treated in accordance with the embodiment 1 of the present invention.

FIG. 3(*b*) shows a surface SEM observation image when the AlN was deposited with MOCVD on the graphite substrate provided with an amorphous carbon layer.

FIG. 4(*a*) shows a cross-sectional TEM observation image in the vicinity of the interface between the graphite substrate and the AlN layer in the embodiment 1 of the present invention.

FIG. 4(*b*) shows a lattice image according to a high-resolution TEM.

DETAILED DESCRIPTION OF PREFERRED EMBODIMENTS

The embodiments of the present invention are described below with reference to the drawings.

Embodiment 1

Figure 1:
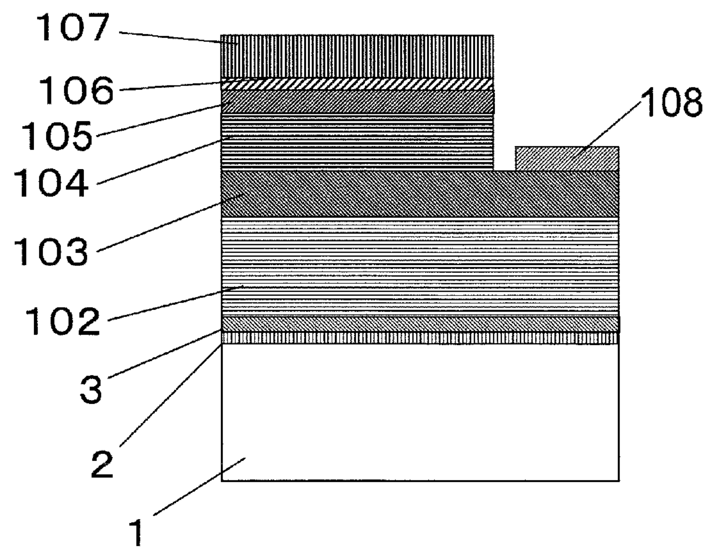
FIG. 1 shows a cross-sectional view of the light-emitting diode element according to the embodiment 1 of the present invention.
Figure 2A:
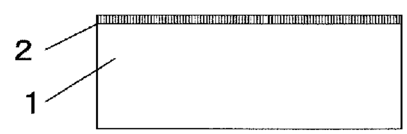
FIGS. 2(*a*)-2(*d*) show cross-sectional views of the method for fabricating the light-emitting diode element according to the embodiment 1 of the present invention.
Figure 2D:
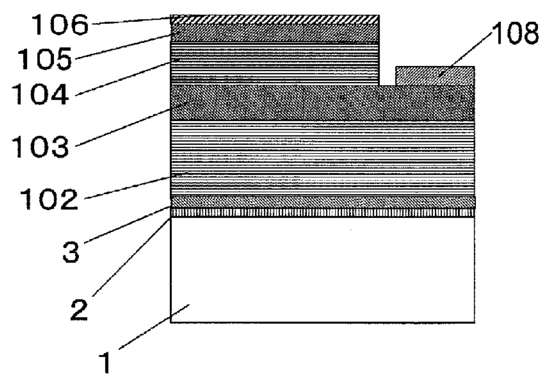
Figure 2B:
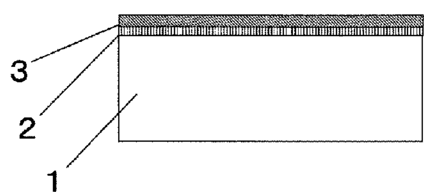
Figure 2C:
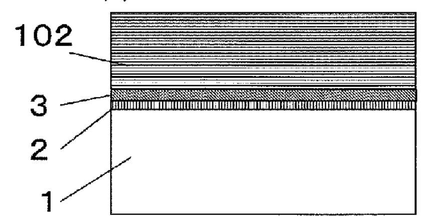
Figure 13:
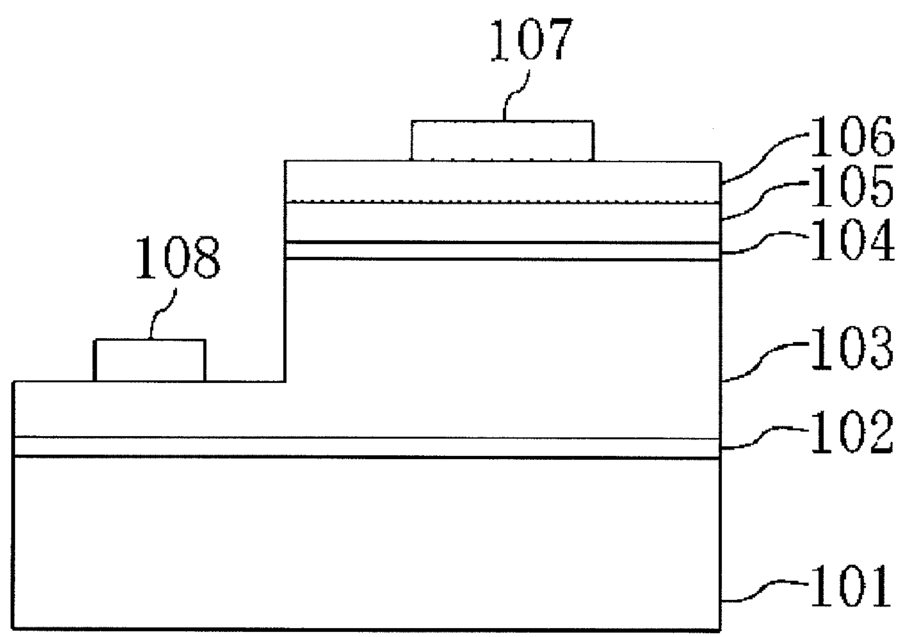
FIG. 13 shows a cross-sectional view of the prior light-emitting diode element.

FIG. 1 shows a cross-sectional view of the light-emitting diode element according to the embodiment 1 of the present invention. With regard to the common elements between FIG. 1 and FIG. 13, identical reference numerals to those in FIG. 13 are used to omit the description.

In FIG. 1, referential mark 1 indicates a graphite substrate. Referential mark 2 indicates an amorphous carbon layer which is caused to be amorphous by an oxygen-asking treatment on the surface of the graphite substrate 1. The oxygen-ashing treatment includes a treatment by oxygen plasma. Referential mark 3 indicates an AlN layer formed on the amorphous carbon layer 2 with MOCVD.

A p-side electrode 107 which is a transparent electrode made of, for example, ITO (indium tin oxide) or a laminate of nickel (Ni) and gold (Au), is formed on a p-type contact layer 106. An n-side electrode 108 including a laminate film of titanium (Ti) and aluminum (Al) is formed on the upper surface of an n-type GaN layer 103.

A fabrication method of the light-emitting diode element is described below with reference to the drawings.

FIG. 2(*a*) to FIG. 2(*d*) show cross-sectional views of the process sequence of the fabrication method of the light-emitting diode element according to the embodiment 1.

In the embodiment 1, an MOCVD method is used as a crystal growth method of a group-III nitride semiconductor. A gallium source includes, for example, trimethylgallium (TMG). An aluminum source includes, for example, trimethylaluminum (TMA). An indium source includes, for example, trimethylindium (TMI). A group-V source (nitrogen source) includes, for example, ammonia ($NH_3$). An n-type dopant source includes, for example, silane ($SiH_4$). A p-type dopant source includes, for example, cyclopentadienylmagnesium (Cp2Mg).

First, as shown in FIG. 2(*a*), the surface of the graphite substrate 1 is reformed by an oxygen-asking method. Namely, the surface is caused to be amorphous. Thus, the amorphous carbon layer 2 is formed. Next, as shown in FIG. 2(*b*), the AlN layer 3 is grown by a MOCVD method on the amorphous carbon layer 2 at the high temperature of approximately 960 degree Celsius. Next, as shown in FIG. 2(*c*), a low-temperature grown buffer layer 102 made of GaN is grown with a low temperature growth at the temperature of, for example, approximately 500 degree Celsius. Further, as shown in FIG. 2(*d*), the n-type cladding layer 103 formed with a high temperature growth at the temperature of approximately 900 degree Celsius, the multi-quantum well layer 104 including $In_xGa_{1-x}N$ and GaN, the p-type cladding layer 105 made of p-type GaN, and the p-type contact layer 106 made of p-type GaN are formed in this order.

The amorphous carbon layer 2 is provided by the oxygen-asking treatment on the surface of the graphite substrate 1. Furthermore, the AlN layer 3 is formed on the amorphous carbon layer 2 with MOCVD. These allow the fully-dense and c-axis oriented AlN layer 3 to be prepared. Accordingly, the formation of a high grade GaN thin film with a small amount of threading dislocations is achieved, although a graphite substrate, which is not a monocrystalline substrate, is used. This allows a GaN light-emitting diode element to be prepared directly on the graphite substrate.

Example 1

FIG. 3(*a*) shows the surface SEM observation image after AlN was deposited with MOCVD on the graphite substrate 1 where the surface treatment by the oxygen-asking was not performed. FIG. 3(*b*) shows the surface SEM observation image after the AlN layer 3 with a thickness of 20 nanometers was formed with MOCVD on the graphite substrate provided with the amorphous carbon layer 2 with a thickness of 20 nanometers formed by the surface treatment of oxygen-asking.

As is clear from FIG. 3(*a*), a monocrystalline AlN thin film was not formed on the graphite substrate 1 where the surface treatment of oxygen-asking was not performed. Only a microcrystal such as an arboroid crystal was deposited. On the contrary, as is clear from FIG. 3(*b*), the dense monocrystalline AlN film was formed on the graphite substrate 1 provided with the amorphous carbon layer 2 on its surface.

FIG. 4(*a*) shows the cross-sectional TEM observation image of the substrate when the AlN layer 3 with a thickness of 20 nanometers formed with MOCVD, the GaN low-temperature grown buffer layer 102 with a thickness of 1 micrometer, and the n-type GaN cladding layer 103 with a thickness of 200 nanometers were grown on the graphite substrate 1 provided with the amorphous carbon layer 2 with a thickness of 20 nanometers on its surface. FIG. 4(*b*) shows the observation result of the lattice image in the vicinity of the interface between the graphite substrate and the AlN layer with use of a high-resolution TEM.

From FIG. 4(*a*) and FIG. 4(*b*), it is understood that the dense AlN crystal was formed on the surface of the amorphous carbon layer, and the excellent GaN crystal was formed on the AlN crystal. The dislocation density calculated from the TEM observation was low. Particularly, the dislocation density was $2\times10^9$ $cm^{-2}$. This dislocation density is the same degree as that of the GaN thin film formed with use of a GaN low-temperature grown buffer layer on a sapphire substrate. It was discovered that the formation of the nitride thin film with high crystallinity even on a graphite substrate, which is non-monocrystalline, was achieved by providing the amorphous carbon layer 2 on the surface of the graphite substrate.

Figure 5:
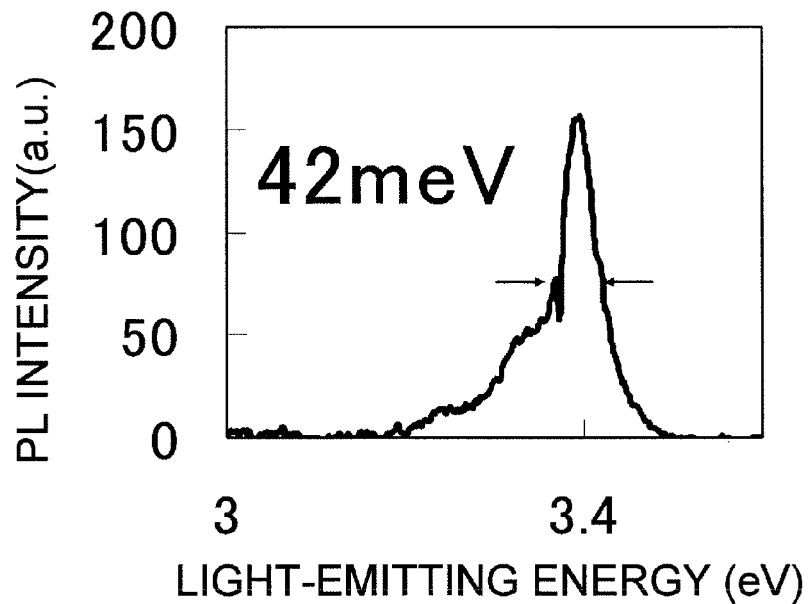
FIG. 5 is a graph showing a photoluminescence measurement result of the GaN film prepared on the graphite substrate according to the embodiment 1 of the present invention.

FIG. 5 shows the measurement result of the photoluminescence (PL) of the sample after the AlN layer 3 with a thickness of 20 nanometers formed with MOCVD, the GaN low-temperature grown buffer layer 102 with a thickness 1 micrometer, and the n-type GaN cladding layer 103 with a thickness of 200 nanometers were grown on the graphite substrate 1 provided with the amorphous carbon layer 2 with a thickness of 20 nanometers. The excitation light source of the PL measurement was a He—Cd laser.

As is clear from FIG. 5, the luminescence peak from the n-type GaN cladding layer 103 was observed in the vicinity of 3.4 eV. The half-value width was 42 meV, which was precipitous.

Table 1 shows the half-value widths of the PL luminescence peaks of samples after the AlN layer 3 with a thickness of 20 nm, the GaN low-temperature grown buffer layer 102, and the n-type GaN gladding layer 103 with a thickness of 200 nanometers were grown on the graphite substrate provided with the amorphous carbon layer with a thickness of 20 nanometers and on the graphite substrate without the amorphous carbon layer.

TABLE 1

| | Half-value width (meV) |
|---|---|
| Without the amorphous carbon layer | 62 |
| With the amorphous carbon layer | 42 |

As is clear from Table 1, the half-value width of the PL luminescence peak of the GaN layer on the graphite substrate without the amorphous carbon layer is 62 meV, while the half-value width of the PL luminescence peak of the GaN layer on the graphite substrate provided with the amorphous carbon layer is 42 meV.

From Table 1, it is considered that the crystallinity of the AlN layer and the GaN layer thereon is improved and that non-luminescence transition derived from lattice defects is decreased, since the amorphous carbon layer is provided on the graphite substrate.

Presumably, the reason why the dense AlN thin film is grown by forming the amorphous carbon layer 2 by the oxygen-asking treatment on the surface of the graphite substrate 1 is explained as below. In an ordinal graphite surface, electrons are delocalized due to pi bonds consisted of the $sp^2$ hybrid orbital of a graphene. On the other hand, in the surface reformed layer having the amorphous surface by the oxygen-asking treatment, the pi bonds are fragmented anywhere. As a result, not only $sp^2$ orbital but also $sp^3$ orbital exist on the surface of the surface reformed layer.

Table 2 shows adsorption energies of an Al atom and an N atom with regard to the $sp^2$ orbital and the $sp^3$ orbital of a carbon, which are calculated in accordance with first principle calculation.

TABLE 2

| Adsorption Atom | $sp^2$ | $sp^3$ |
|---|---|---|
| N | 447 | −49 |
| Al | 227 | −138 |

(kcal/mol)

As is clear from Table 2, the adsorption energies of the Al atom and the N atom with regard to $sp^2$ orbital are positive values, while those with regard to $sp^3$ orbital are negative values. This means that Al and N are easy to adsorb to $sp^3$ orbital spontaneously.

The amorphous carbon layer 2 is formed by the oxygen-asking treatment on the surface of the graphite substrate. Presumably, this allows a lot of $sp^3$ orbitals of carbon to be formed, and promotes core formation at an initial stage of the AlN growth. As a result, an excellent crystalline film is grown.

Table 3 shows the half-value widths of (0002) peaks obtained with the rocking curve of XRD of the GaN when the amorphous carbon layers with various thicknesses are used. The thickness of the amorphous carbon layer can be varied by, for example, adjusting a treatment time in the oxygen-asking.

TABLE 3

| Film thickness (nm) | Half-value width (arcsec) |
|---|---|
| 0 | — |
| 20 | 2700 |
| 40 | 2500 |
| 60 | 3200 |
| 80 | 10500 |

As long as the thickness of the amorphous carbon layer is not less than 20 nanometers and not more than 60 nanometers, the GaN film is c-axis-oriented and the film with excellent half-value width was obtained. When the thickness of the amorphous carbon layer exceeds about 80 nm, since the amount of the oxygen which moved into the graphite thin film during the oxygen-asking treatment, on the subsequent growth of AlN and GaN with MOCVD, the oxygen which has moved into the graphite thin film reacts with Al or Ga. This prevents the formation of the precipitous interface. Accordingly, the thickness of the amorphous carbon layer 2 is preferably not less than 20 nanometers and not more than 60 nanometers.

Figure 6:
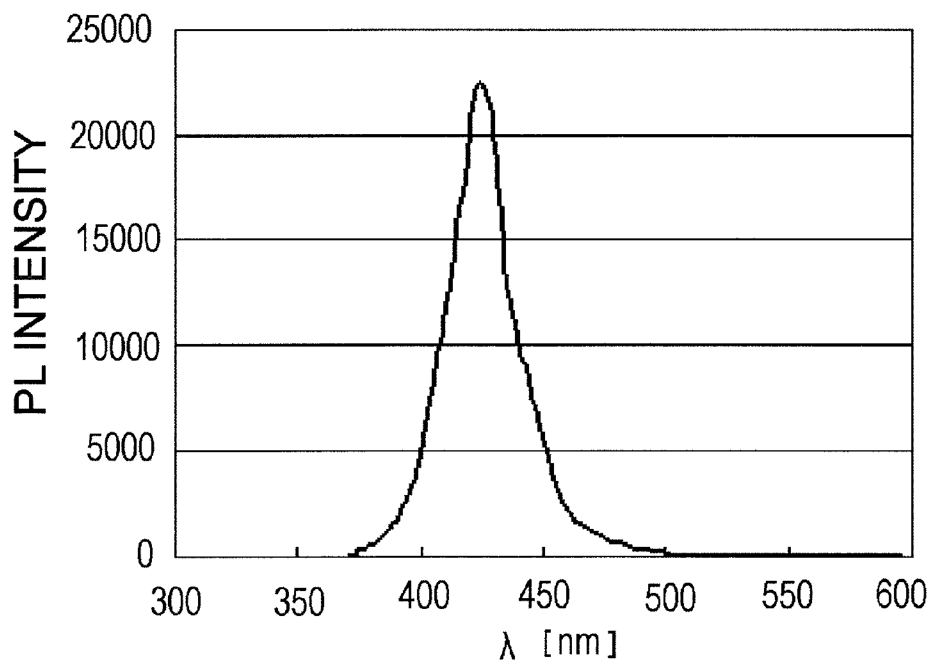
FIG. 6 is a graph showing a photoluminescence measurement result of the light-emitting diode element prepared on the graphite substrate according to the embodiment 1 of the present invention.

FIG. 6 shows that PL measurement result of a sample after the AlN layer 3 with a thickness of 20 nanometers, the GaN low-temperature grown buffer layer 102 with a thickness of 4 micrometers, the n-type GaN cladding layer 103 with a thickness of 100 nanometers, the multi-quantum well layer 104 formed by stacking $In_{0.12}Ga_{0.88}N$ with a thickness of 2.5 nanometers and GaN with a thickness of 8 nanometers five times alternately, the p-type GaN cladding layer 105 with a thickness of 200 nanometers, and the p-type GaN contact layer 106 with a thickness of 20 nanometers were grown in this order on the graphite substrate 1 provided with the amorphous carbon layer 2 with a thickness of 20 nm.

As is clear from FIG. 6, the clear luminescence peak from the multi-quantum well layer 104 was observed in 420 nanometers.

Figure 7:
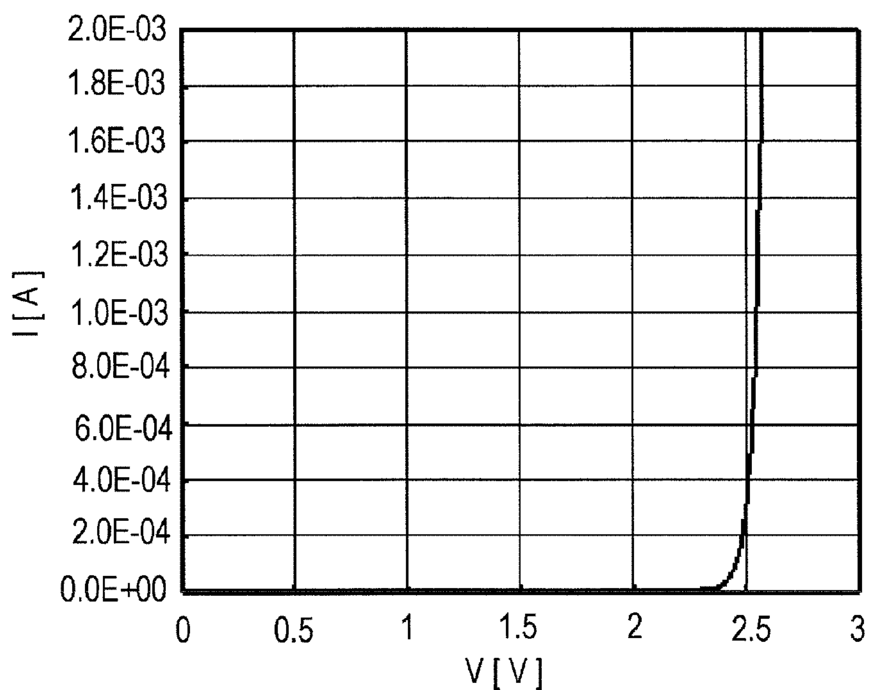
FIG. 7 is a graph showing an I-V property of the light-emitting diode element prepared on the graphite substrate according to the embodiment 1 of the present invention.
Figure 8:
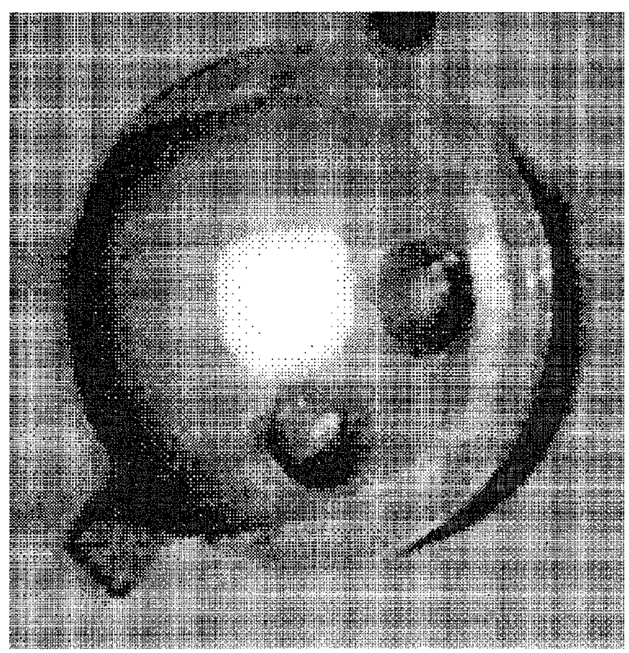
FIG. 8 is a microscope photograph of the light-emitting diode element prepared on the graphite substrate according to the embodiment 1 of the present invention when it lights.

FIG. 7 shows the I-V property of the light-emitting diode element obtained by providing the ITO electrode with a thickness of 100 nanometers as the p-side electrode 107 on the p-type GaN contact layer 106 and dividing each of the elements with a dicer. The size of the element was 1 mm×1 mm. As is clear from FIG. 7, the light-emitting element prepared on the graphite substrate according to the example 1 had an excellent diode property. When the forward voltage was approximately 2.4V, the light-emitting element began to light up. FIG. 8 shows the observation result of the light-emitting element when it lights up at an applied voltage of 2.7 V. The light-emitting diode element according to the example 1 emitted blue light clearly.

Embodiment 2

Figure 9:
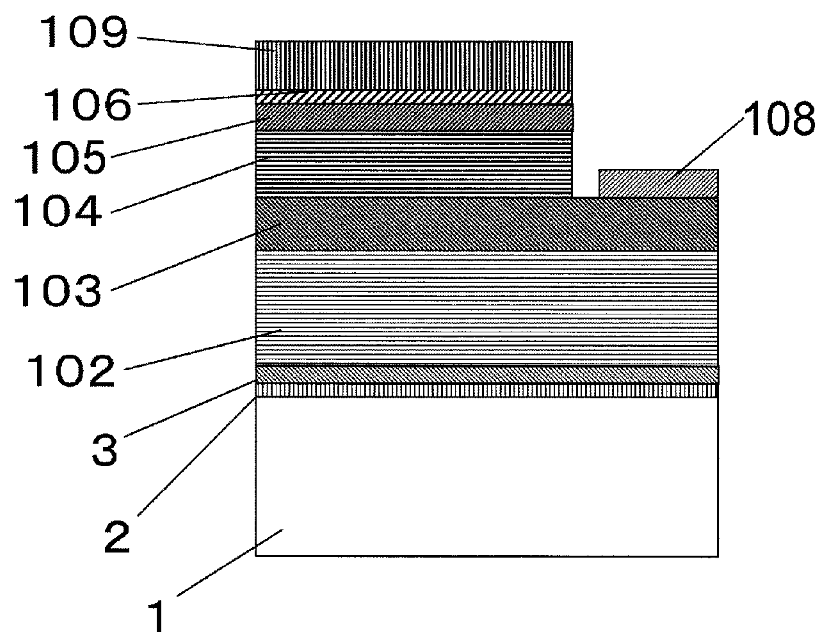
FIG. 9 shows a cross-sectional view of the light-emitting diode element according to the embodiment 2 of the present invention.

FIG. 9 shows a cross-sectional view of the light-emitting diode element according to the embodiment 2 of the present invention. The difference from FIG. 1 lies in that the p-type electrode 109 is a zinc oxide (ZnO) film prepared by liquid phase synthesis.

Example 2

The method of the liquid phase synthesis is described below.

Hexamethylenetetramine ($(CH_2)_6N_4$) at a concentration of 0.1 mol/L was dropped in a zinc nitrate ($ZnNO_3$) solution at a concentration of 0.1 mol/L, and the pH was adjusted to 5 to 7. A photoresist film was applied onto the light-emitting diode structure to expose only the p-type GaN contact layer 106 by photolithography. Then, the light-emitting diode structure was immersed in the solution and stood still for two to six hours while the solution temperature was maintained at 70 degree Celsius. Thus, a ZnO film was grown on the p-type GaN contact layer. The thickness of the film was controlled by the growth period. The growth rate was approximately 2.7 nanometers/minute. After the ZnO film was grown, the resist was removed with acetone, and the diode was dried.

Figure 10:
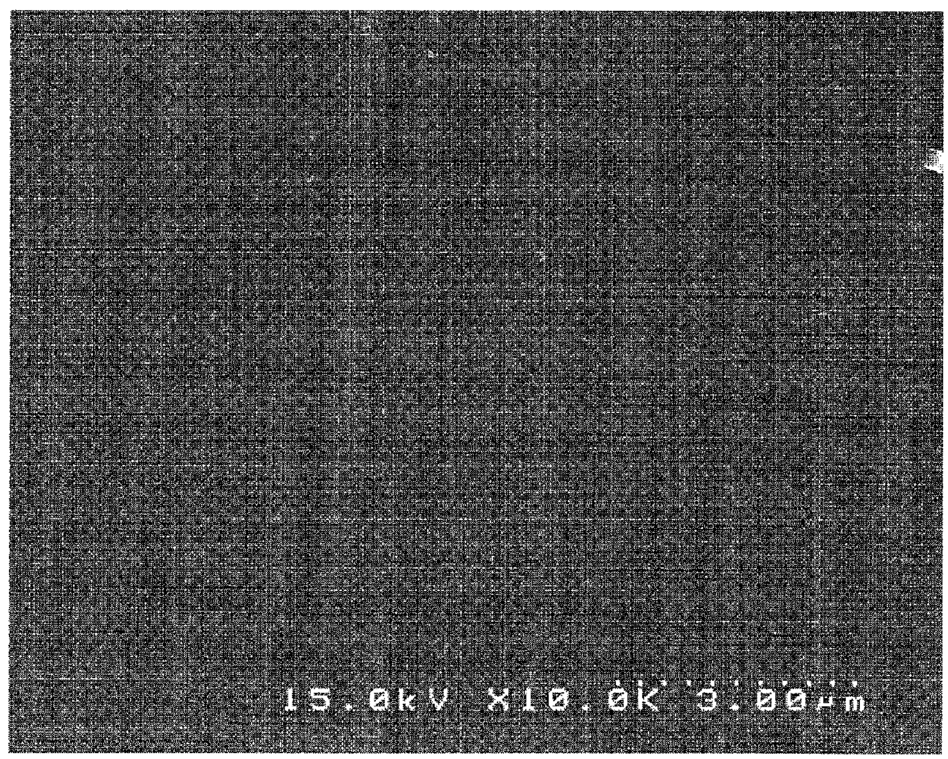
FIG. 10 is a microscope photograph showing the surface SEM observation image of a ZnO film grown on the p-type GaN film by stacking synthesis according to the embodiment 2 of the present invention.
Figure 11:
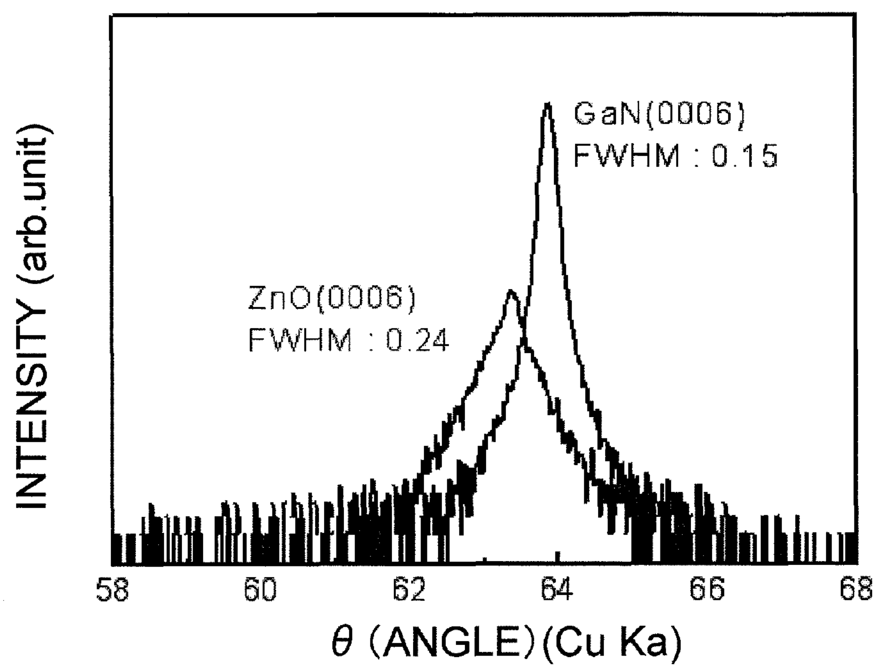
FIG. 11 is a graph showing the XRD rocking curve of the ZnO film grown on the p-type GaN film by stacking synthesis according to the embodiment 2 of the present invention.

FIG. 10 shows the surface SEM observation image when the ZnO with a thickness of 500 nanometers was grown. FIG. 11 shows the XRD rocking curve when the ZnO with a thickness of 500 nanometers was grown.

From FIG. 10 and FIG. 11, it is understood that the ZnO film grown on GaN by the liquid phase synthesis has a flat surface with high crystallinity. As the result of the UV-visible transmittance measurement, the transmittance of the ZnO film is not more than 95%, which is high, in a wide range of not less than 350 nanometers and not more than 2.5 micrometers. Furthermore, as the result of the resistivity measurement by a four-terminal method, the resistivity was relatively low. Particularly, it was $1.2\times10^{-2}$ ohm·cm. This resistivity means that the resultant ZnO film is sufficiently usable as a transparent electrode.

Figure 12:
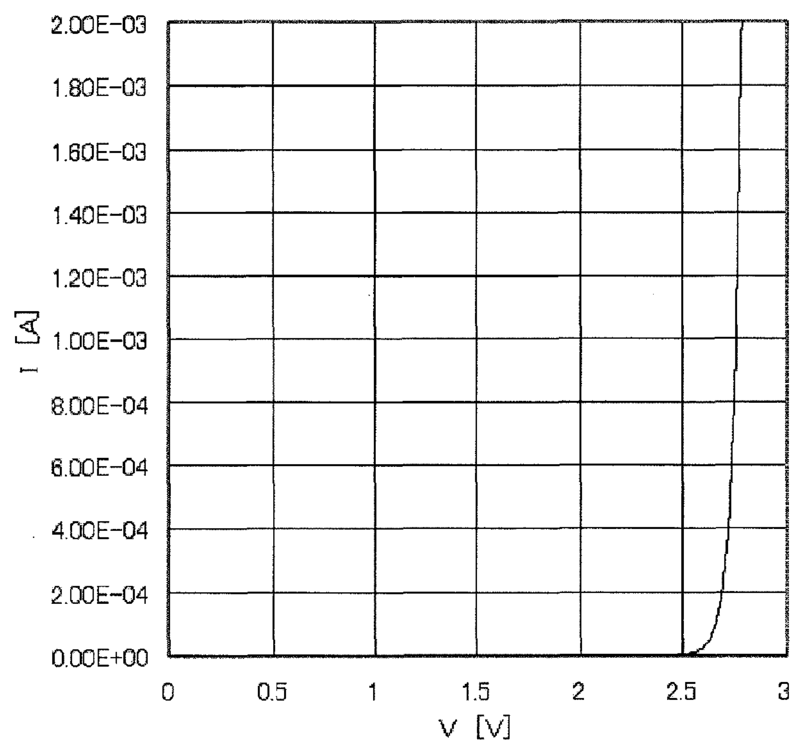
FIG. 12 is a graph showing the I-V property of the light-emitting diode element according to the embodiment 2 of the present invention.

FIG. 12 shows the I-V property of the light-emitting diode element according to the present example 2, after each of the elements was divided with a dicer. As is clear from FIG. 12, the light-emitting diode element according to the present example 2, which was formed on the graphite, had an excellent diode property identically to that of the example 1. When a voltage of 2.5V was applied, the light-emitting diode element began to light.

From these results, the preparation of the GaN film with high crystallinity similar to the case where a GaN film is formed on a sapphire substrate is achieved by providing the amorphous carbon layer by the oxygen-asking treatment on the surface of the graphite substrate and then providing the AlN layer with MOCVD. As a result, a blue light-emitting diode element can be obtained at low cost.

The above multi-quantum well layer 104 was obtained by repeating the alternate stack of the $In_xGa_{1-x}N$ (x=0.12) and the GaN five times. However, x may be not less than 0.01 and not more than 0.20, and the number of the stacking times may be not less than 1 and not more than 10.

The light-emitting diode element of the present invention has the amorphous carbon layer on the graphite substrate, and the AlN layer and the GaN layer with high crystallinity by forming with MOCVD. The light-emitting diode element of the present invention is useful as an illumination device and a display device. The technology of the light-emitting diode element of the present invention can also be applied to an electric device such as a high-frequency device or a power device.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method of fabricating a light-emitting diode, the method comprising steps of:

a step (a) of treating a surface of a graphite substrate by oxygen-ashing and forming an amorphous carbon layer having a thickness of not less than 20 nm and not more than 60 nm on the surface of the graphite substrate;

a step (b) of forming an AlN layer on the amorphous carbon layer with MOCVD (Metal Organic Chemical Vapor Deposition);

a step (c) of forming an n-type cladding layer consisting of a nitride semiconductor on the AlN layer;

a step (d) of forming a quantum well layer consisting of a nitride semiconductor on the n-type cladding layer; and a step (e) of forming a p-type cladding layer consisting of a nitride semiconductor on the quantum well layer.

2. The method according to claim 1, further comprising a step of forming a buffer layer consisting of a nitride semiconductor on the AlN layer prior to forming the n-type cladding layer.

3. The method according to claim 2, further comprising forming a p-side electrode, wherein the p-side electrode is transparent.

4. The method according to claim 3, wherein the quantum well layer consists of a multi-quantum well layer.

5. The method according to claim 1, further comprising forming a p-side electrode, wherein the p-side electrode is transparent.

6. The method according to claim 1, wherein the quantum well layer consists of a multi-quantum well layer.

7. The method according to claim 1, further comprising forming a p-side electrode by a liquid phase synthesis.

8. The method according to claim 7, wherein the p-side electrode is made of ZnO.

9. A substrate comprising:

a graphite substrate;

an amorphous carbon layer having a thickness of not less than 20 nm and not more than 60 nm formed on the graphite substrate; and an AlN layer formed on the amorphous carbon layer.

10. A method of fabricating a substrate, the method comprising steps of:

a step (a) of treating a surface of a graphite substrate by oxygen ashing and forming an amorphous carbon layer having a thickness of not less than 20 nm and not more than 60 nm on the surface of the graphite substrate; and a step (b) of forming an AlN layer on the amorphous carbon layer with MOCVD (Metal Organic Chemical Vapor Deposition).

11. A light-emitting diode comprising:

a graphite substrate;

an amorphous carbon layer formed on the graphite substrate;

an AlN layer formed on the amorphous carbon layer;

an n-type cladding layer consisting of a nitride semiconductor formed on the AlN layer;

a quantum well layer consisting of a nitride semiconductor formed on the n-type cladding layer;

a p-type cladding layer consisting of a nitride semiconductor formed on the quantum well layer;

a p-side electrode electrically connected to the p-type cladding layer; and an n-type electrode electrically connected to the n-type cladding layer, wherein the amorphous carbon layer has a thickness of not less than 20 nm and not more than 60 nm.

12. The light-emitting diode according to claim 11, further comprising a buffer layer comprising a nitride semiconductor interposed between the AlN layer and the n-type cladding layer.

13. The light-emitting diode according to claim 12, wherein the p-side electrode is transparent.

14. The light-emitting diode according to claim 13, wherein the quantum well layer consists of a multi-quantum well layer.

15. The light-emitting diode according to claim 11, wherein the p-side electrode is transparent.

16. The light-emitting diode according to claim 11, wherein the quantum well layer consists of a multi-quantum well layer.

17. A method of emitting a light with a light-emitting diode, the method comprising steps of:

a step (a) of preparing the light-emitting diode comprising:

a graphite substrate, an amorphous carbon layer formed on the graphite substrate, an AlN layer formed on the amorphous carbon layer, an n-type cladding layer consisting of a nitride semiconductor and formed on the AlN layer, a quantum well layer consisting of a nitride semiconductor and formed on the n-type cladding layer, a p-type cladding layer consisting of a nitride semiconductor and formed on the quantum well layer, a p-side electrode electrically connected to the p-type cladding layer, and an n-side electrode electrically connected to the n-type cladding layer, wherein the amorphous carbon layer has a thickness of not less than 20 nm and not more than 60 nm; and a step (b) of applying a voltage between the p-side electrode and the n-type electrode to emit light from the quantum well layer.

18. The method according to claim 17, wherein the p-side electrode is transparent.

19. The method according to claim 17, wherein the quantum well layer consists of a multi-quantum well layer.

* * * * *